United States Patent
Van Zwol et al.

(10) Patent No.: US 12,072,620 B2
(45) Date of Patent: Aug. 27, 2024

(54) METHOD OF MANUFACTURING A MEMBRANE ASSEMBLY

(71) Applicant: ASML NETHERLANDS B.V., Veldhoven (NL)

(72) Inventors: Pieter-Jan Van Zwol, Eindhoven (NL); Sander Baltussen, Castenray (NL); Dennis De Graaf, Waalre (NL); Johannes Christiaan Leonardus Franken, Knegsel (NL); Adrianus Johannes Maria Giesbers, Vlijmen (NL); Alexander Ludwig Klein, Eindhoven (NL); Johan Hendrik Klootwijk, Eindhoven (NL); Peter Simon Antonius Knapen, Deurne (NL); Evgenia Kurganova, Nijmegen (NL); Alexey Sergeevich Kuznetsov, Zaltbommel (NL); Arnoud Willem Notenboom, Rosmalen (NL); Mahdiar Valefi, Eindhoven (NL); Marcus Adrianus Van de Kerkhof, Helmond (NL); Wilhelmus Theodorus Anthonius Johannes Van den Einden, Deurne (NL); Ties Wouter Van der Woord, Eindhoven (NL); Hendrikus Jan Wondergem, Veldhoven (NL); Aleksandar Nikolov Zdravkov, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 268 days.

(21) Appl. No.: 17/278,356

(22) PCT Filed: Oct. 2, 2019

(86) PCT No.: PCT/EP2019/076667
§ 371 (c)(1),
(2) Date: Mar. 22, 2021

(87) PCT Pub. No.: WO2020/078721
PCT Pub. Date: Apr. 23, 2020

(65) Prior Publication Data
US 2022/0035239 A1 Feb. 3, 2022

(30) Foreign Application Priority Data

Oct. 15, 2018 (EP) .................................. 18200397
Jun. 17, 2019 (EP) .................................. 19180527

(51) Int. Cl.
*G03F 1/64* (2012.01)
*G03F 7/00* (2006.01)

(52) U.S. Cl.
CPC .............. *G03F 1/64* (2013.01); *G03F 7/7015* (2013.01)

(58) Field of Classification Search
CPC ...... G03F 1/64; G03F 7/7015; G03F 7/70191; G03F 7/70308; G03F 7/70916; G03F 1/62
See application file for complete search history.

(56) References Cited

U.S. PATENT DOCUMENTS

2006/0243655 A1 11/2006 Striemer et al.
2016/0170304 A1* 6/2016 Park ...................... G03F 7/0046
430/326

(Continued)

FOREIGN PATENT DOCUMENTS

CN 106462052 2/2017
JP 2011530818 12/2011

(Continued)

OTHER PUBLICATIONS

Kastenmeier, B. E. E., P. J. Matsuo, and G. S. Oehrlein. "Highly selective etching of silicon nitride over silicon and silicon dioxide." Journal of Vacuum Science & Technology A: Vacuum, Surfaces, and Films 17.6 (1999): 3179-3184. (Year: 1999).*

(Continued)

Primary Examiner — Mark F. Huff
Assistant Examiner — Moriah S. Smoot
(74) Attorney, Agent, or Firm — Pillsbury Winthrop Shaw Pittman, LLP

(57) ABSTRACT

A method for manufacturing a membrane assembly for EUV lithography, the method including: providing a stack including: at least one membrane layer supported by a planar substrate, wherein the planar substrate has an inner region and a border region around the inner region; and a first sacrificial layer between the planar substrate and the membrane layer; selectively removing the inner region of the planar substrate such that the membrane assembly has: a membrane formed from the at least one membrane layer, and a border holding the membrane, the border having the border region of the planar substrate and the first sacrificial layer situated between the border region and the membrane layer, wherein the selectively removing the inner region of the planar substrate includes using an etchant which has a similar etch rate for the membrane layer and its oxide and a substantially different etch rate for the first sacrificial layer.

20 Claims, 5 Drawing Sheets

(56) References Cited

U.S. PATENT DOCUMENTS

| | | |
|---|---|---|
| 2017/0205705 A1 | 7/2017 | Ma et al. |
| 2018/0239240 A1 | 8/2018 | Houweling et al. |
| 2019/0056654 A1 | 2/2019 | Peter et al. |

FOREIGN PATENT DOCUMENTS

| | | | | |
|---|---|---|---|---|
| JP | 2013519998 | 5/2013 | | |
| JP | 2013526044 | 6/2013 | | |
| JP | 2018526676 | 9/2018 | | |
| NL | 2017370 A * | 3/2017 | | |
| TW | 201725178 | 7/2017 | | |
| TW | 201732442 | 9/2017 | | |
| WO | WO-2017036944 A1 * | 3/2017 | ............... | G03F 1/62 |
| WO | 2017076686 | 5/2017 | | |
| WO | WO-2017076686 A1 * | 5/2017 | ............... | G03F 1/24 |
| WO | 2017102379 | 6/2017 | | |
| WO | 2017102383 | 6/2017 | | |
| WO | WO-2017102379 A1 * | 6/2017 | ............... | G03F 1/24 |
| WO | WO-2017102383 A1 * | 6/2017 | ............... | G03F 1/62 |

OTHER PUBLICATIONS

Office Action issued in corresponding Taiwanese Patent Application No. 108136813, dated Jun. 9, 2023.
International Search Report and Written Opinion issued in corresponding PCT Patent Application No. PCT/EP2019/07667, dated Dec. 17, 2019.
Williams, K.R. et al.: "Etch Rates for Micromachining Processing", Journal of Microelectromechanical Systems, vol. 5, No. 4, Dec. 1, 1996.
Goldfarb, D.: "Fabrication of a full-size EUV pellicle based on silicon nitride", Proc. of SPIE, vol. 9635, Oct. 23, 2015.
Office Action issued in corresponding Japanese Patent Application No. 2021-516365, dated Oct. 11, 2023.
Office Action issued in corresponding Canadian Patent Application No. 3,116,145, dated Feb. 19, 2024.
Office Action issued in corresponding Chinese Patent Application No. 201980068236.X, dated May 21, 2024.

* cited by examiner

METHOD OF MANUFACTURING A MEMBRANE ASSEMBLY

CROSS-REFERENCE TO RELATED APPLICATIONS

This application is the U.S. national phase entry of PCT Patent Application No. PCT/EP2019/076667 which was filed on Oct. 2, 2019, which claims the benefit of priority of European Patent Application No. 18200397.0 which was filed on Oct. 15, 2018 and of European Patent Application No. 19180527.4 which was filed on Jun. 17, 2019, and which are incorporated herein in their entireties by reference.

The present invention relates to a method for manufacturing a membrane assembly, and to a membrane assembly, as well as to an optical element for a lithographic apparatus and method for manufacturing the same.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A lithographic apparatus includes a patterning device (e.g. a mask or reticle). Radiation is provided through or reflected off the patterning device to form an image on a substrate. A membrane assembly, also referred to as a pellicle, may be provided to protect the patterning device from airborne particles and other forms of contamination. Contamination on the surface of the patterning device can cause manufacturing defects on the substrate.

Pellicles may also be provided for protecting optical components other than patterning devices. Pellicles may also be used to provide a passage for lithographic radiation between regions of the lithography apparatus which are sealed from one another. Pellicles may also be used as filters, such as spectral purity filters or as part of a dynamic gas lock of a lithographic apparatus.

A mask assembly may include the pellicle which protects a patterning device (e.g. a mask) from particle contamination. The pellicle may be supported by a pellicle frame, forming a pellicle assembly. The pellicle may be attached to the frame, for example, by gluing or otherwise attaching a pellicle border region to the frame. The frame may be permanently or releasably attached to a patterning device.

The membrane assembly may comprise a border and a membrane stretched across the border. It is difficult to manufacture the membrane assembly without the membrane assembly being deformed in the process, for example because of the thinness of the membrane. Especially when the membrane in the membrane assembly is only supported at the border, with no other support or reinforcement means such as a grid or a substrate beneath the membrane to provide additional mechanical strength, then the membrane assembly may become more easily deformable. Furthermore, pellicle assemblies with a large membrane area as required for a lithographic patterning device are very likely to deform under stress. Deformation of the membrane assembly may lead to reduced performance, membrane damaging or even breakup, which is undesired.

Due to the presence of the pellicle in the optical path of the EUV radiation beam, it is necessary for the pellicle to have high EUV transmissivity. A high EUV transmissivity allows a greater proportion of the incident radiation through the pellicle and reducing the amount of EUV radiation absorbed by the pellicle may decrease the operating temperature of the pellicle. Since transmissivity is at least partially dependent on the thickness of the pellicle, it is desirable to provide a pellicle which is as thin as possible whilst remaining reliably strong enough to withstand the sometimes hostile environment within a lithography apparatus. It is also desirable to provide a method which provides for membrane assemblies that have predictable and consistent physical properties. If a method provides pellicles having different physical properties, it may be the case that one pellicle is able to withstand use in a lithographic apparatus whereas another fails within a shorter period of time. This unpredictability of how a pellicle is able to withstand use necessitates a very conservative approach to the expected lifetime of a pellicle, which may result in the pellicle being replaced more frequently than may be required.

It is therefore desirable to provide a method for producing a pellicle which results in a pellicle having a high EUV transmissivity and which can reliably produce pellicles with consistent physical properties, as well as a pellicle produced according to such a method. It is also desirable to increase the lifespan of a pellicle in order to reduce downtime of the apparatus.

Whilst the present application generally refers to pellicles in the context of lithography apparatus, in particular EUV lithography apparatus, the invention is not limited to only pellicles and lithography apparatus and it is appreciated that the subject matter of the present invention may be used in any other suitable apparatus or circumstances.

For example, the methods of the present invention may equally be applied to spectral purity filters. Some EUV sources, such as those which generate EUV radiation using a plasma, do not only emit desired 'in-band' EUV radiation, but also undesirable (out-of-band) radiation. This out-of-band radiation is most notably in the deep UV (DUV) radiation range (100 to 400 nm). Moreover, in the case of some EUV sources, for example laser produced plasma EUV sources, the radiation from the laser, usually at 10.6 microns, presents a significant out-of-band radiation.

In a lithographic apparatus, spectral purity is desired for several reasons. One reason is that the resist is sensitive to out of-band wavelengths of radiation, and thus the image quality of patterns applied to the resist may be deteriorated if the resist is exposed to such out-of-band radiation. Furthermore, out-of-band radiation infrared radiation, for example the 10.6 micron radiation in some laser produced plasma sources, leads to unwanted and unnecessary heating of the patterning device, substrate, and optics within the lithographic apparatus. Such heating may lead to damage of these elements, degradation in their lifetime, and/or defects or distortions in patterns projected onto and applied to a resist-coated substrate.

A typical spectral purity filter may be formed, for example, from a silicon foundation structure (e.g. a silicon grid, or other member, provided with apertures) that is coated with a reflective metal, such as molybdenum. In use, a typical spectral purity filter might be subjected to a high heat load from, for example, incident infrared and EUV radiation. The heat load might result in the temperature of the spectral purity filter being above 800° C. Under the high head load, the coating can delaminate due to a difference in the coefficients of linear expansion between the reflective molybdenum coating and the underlying silicon support structure. Delamination and degradation of the silicon foundation structure is accelerated by the presence of hydrogen, which is often used as a gas in the environment in which the spectral purity filter is used in order to suppress debris (e.g. debris, such as particles or the like), from entering or leaving certain parts of the lithographic apparatus. Thus, the spectral purity filter may be used as a pellicle, and vice versa. Therefore, reference in the present application to a 'pellicle' is also reference to a 'spectral purity filter'. Although reference is primarily made to pellicles in the present application, all of the features could equally be applied to spectral purity filters.

In addition, it is desirable to improve the lifespan of optical elements within a lithographic apparatus, such as the collector mirror, pellicle, or components of the dynamic gas lock. These optical elements are exposed to the harsh environment of the lithographic apparatus when in use and so can become damaged over time. It is desirable to prevent, reduce, or eliminate damage to the optical elements.

In a lithographic apparatus (and/or method) it is desirable to minimise the losses in intensity of radiation which is being used to apply a pattern to a resist coated substrate. One reason for this is that, ideally, as much radiation as possible should be available for applying a pattern to a substrate, for instance to reduce the exposure time and increase throughput. At the same time, it is desirable to minimise the amount of undesirable radiation (e.g. out-of-band) radiation that is passing through the lithographic apparatus and which is incident upon the substrate. Furthermore, it is desirable to ensure that a spectral purity filter used in a lithographic method or apparatus has an adequate lifetime, and does not degrade rapidly over time as a consequence of the high heat load to which the spectral purity filter may be exposed, and/or the hydrogen (or the like, such as free radical species including H* and HO*) to which the spectral purity filter may be exposed. It is therefore desirable to provide an improved (or alternative) spectral purity filter, and for example a spectral purity filter suitable for use in a lithographic apparatus and/or method.

It is desirable to reduce the possibility of a membrane assembly such as a pellicle being deformed or damaged during its manufacture as any flaws in the pellicle can reduce the performance and/or the lifespan of the pellicle.

The present invention has been devised in an attempt to address at least some of the problems identified above.

SUMMARY OF THE INVENTION

According to a first aspect of the present invention, there is provided a method for manufacturing a membrane assembly for EUV lithography, the method comprising:
  i) providing a stack comprising:
    at least one membrane layer supported by a planar substrate, wherein the planar substrate comprises an inner region and a border region around the inner region; and a first sacrificial layer between the planar substrate and the membrane layer;
  ii) selectively removing the inner region of the planar substrate, wherein the step of selectively removing the inner region of the planar substrate comprises using an etchant which has a similar etch rate for the membrane layer and its oxide and a substantially different etch rate for the first sacrificial layer;
  such that the membrane assembly comprises: a membrane formed at least from the one membrane layer; and a border holding the membrane, the border comprising the border region of the planar substrate and the first sacrificial layer situated between the border and the membrane layer.

The method according to the present invention reduces the risk posed by over-etching of the stack, which can weaken the ultimate pellicle and increase the risk of failure of the pellicle. It is believed that in methods where the etch rate of the sacrificial layer and the membrane layer and its oxide are substantially the same that there is a risk of over-etching the sacrificial layer. In addition, where the etch rate of the membrane layer (or indeed any other layer in the stack) and its oxide are not substantially the same, preferential etching of either the material of the membrane (or other layer) or its oxide may results in the formation of weaknesses, possibly in the form of notches, in the membrane assembly. It is desirable to ensure that the sacrificial layer is completely removed from the membrane assembly as any remaining sacrificial layer may reduce the EUV transmissivity of the membrane assembly. However, the thickness of the sacrificial layer as well as the rate at which it is etched away can vary. As such, there is a risk that the membrane assembly may be etched for longer than is necessary. Without wishing to be bound by scientific theory, it is believed that over-etching of native oxide along grain boundaries during etching may result in the formation of notches in the surface. These notches serve as weak points in the ultimate membrane assembly and may thereby weaken the assembly.

Preferably, at least the first sacrificial layer is a tensile layer. By tensile it is understood to mean that the layer exerts a tensile force as opposed to a compressive force. In other methods of producing membrane assemblies, the first sacrificial layer is a compressive layer, that is to say that the layer exerts a compressive force. During processing, the compressive force can cause the membrane assembly to wrinkle, which can cause damage to the membrane assembly, such as the formation of micro-cracks, ultimately weakening the membrane assembly. In addition, the at least membrane layer according to the present invention may also be tensile. Providing a tensile first sacrificial layer reduces the stress differences between the sacrificial layer and the at least one membrane layer. Due to the thinness of the membrane, when there is a pressure difference between the two faces of the membrane, the membrane may be deformed out-of-plane. There is a maximum out-of-plane deflection which is acceptable. The membrane assembly according to the present invention may comprise a degree of pre-tension which serves to resist the out-of-plane deflection. It will be appreciated that in other embodiments, one or more layers may have substantially no compressive or tensile forces.

The stack may further comprise a second sacrificial layer on the at least one membrane layer. In this way, the stack comprises at least one membrane layer which is between a first and a second sacrificial layer. The first and second sacrificial layers may comprise the same material or may comprise different materials. Preferably, the first and second sacrificial layers comprise the same material.

The method may further comprise removing at least a portion of the second sacrificial layer from at least one face of the stack prior to the selective removal of the inner region of the planar substrate. Since the second sacrificial layer may be provided on both faces of the stack and may be substantially resistant to the etchant, it may be necessary to remove at least a portion of the second sacrificial layer from the stack in order to expose the at least one membrane layer to the etchant. It will be appreciated that this step may not be required where the second sacrificial layer is only provided on the upper surface of the stack thereby leaving the lower surface of the stack, namely the membrane layer, exposed.

This step in the method exposes the at least one membrane layer to the etchant to allow the etchant to etch away the membrane layer and the inner region of the planar substrate.

The method may further comprise providing a resist on the stack and patterning the resist. This step preferably takes place prior to the selective removal of the inner region of the planar substrate. The patterning of the resist serves to define the areas of the stack which are removed by a subsequent etching step. Any suitable type of resist may be used.

The resist is resistant to etching by the etchant and protects the portions of the stack which are not desired to be etched away and leaves exposed the portions of the resist which are desired to be etched away. The etch may be allowed to proceed until the etch has reached the planar substrate.

As such, the method may further comprise etching at least a portion of the second sacrificial layer, the membrane and the first sacrificial layer prior to the selective removal of the inner region of the planar substrate.

The method may further comprise, prior to the selective removal of the inner region of the planar substrate, applying a protective layer to a front side of the stack to protect the layers at the front side of the stack from a subsequent etching step.

This step is optional and may be used to hold the stack together whilst the inner region of the planar substrate is etched.

Following the removal of the inner region of the planar substrate, the protective layer may be removed from the stack. This leaves a stack comprising the non-etched border region of the planar substrate with an optional first sacrificial layer on the bottom side, a first sacrificial layer on the top side, the at least one membrane layer on the first sacrificial layer on the top side, and a second sacrificial layer on the at least one membrane layer such that the at least one membrane layer is between the first and the second sacrificial layers, and the first sacrificial layer is between the at least one membrane layer and the border region of the planar substrate.

The method may further comprise removing any remaining second sacrificial layer from the upper surface of the at least one membrane layer.

The step of removing any remaining second sacrificial layer from the upper surface of the at least one membrane layer may comprise etching using an etchant which has an etch rate for the second sacrificial layer which is substantially higher than the etch rate versus the at least one membrane layer and its oxide. Preferably, the etchant etches the sacrificial layer at a rate of at least ten times more than the rate at which the etchant etches the at least one membrane layer and its oxide.

By using an etchant which etches the second sacrificial material at a higher rate than the at least one membrane layer and its oxide, the problem of over-etching is mitigated. Even if the membrane assembly is left in the etchant for longer than is necessary to remove the second sacrificial layer, since the etchant etches the at least one membrane layer and its oxide at a low rate, there is little etching of the at least one membrane layer and its oxide. Also, the formation of notches in the surface is avoided or reduced and the resulting membrane assembly is not weakened.

In any aspect, the etchant may be a chemical etchant. Preferably, the etchant used to remove the second sacrificial material comprises phosphoric acid. Phosphoric acid has been found to etch the second sacrificial material at a rate of around 25 times that of the material of the at least one membrane and its oxide. As such, even if the membrane assembly is exposed to the etchant for longer than necessary to remove the second sacrificial layer, the etchant will not etch the remainder of the membrane assembly to any great degree. It will be appreciated that any etchant which has a similar etch rate for the material of the membrane and its oxide, and wherein such etch rate is considerably less than that of the etch rate for the sacrificial layer may be used.

The planar substrate may be a wafer. Preferably, the wafer comprises silicon. Silicon is a well characterised material which is commonly used in the field.

At least one of the first and second sacrificial layers may comprise silicon nitride. Silicon nitride is a tensile material meaning that during the manufacture of the membrane assembly, the assembly does not wrinkle as is the case when compressive materials are used. In addition, silicon nitride is essentially inert to the etchant which is used to etch away the inner region of the planar substrate and its oxide, so it is not etched along with the inner region of the planar substrate and its oxide. Further, silicon nitride is etched by a different etchant at a much higher rate than the at least one membrane layer and the border region of the planar substrate in the final processing step. Since the silicon nitride can be readily removed without over-etching the border region of the planar substrate and the at least one membrane layer, this reduces the risk of notches being formed in the surface of the at least one membrane layer thereby weakening the at least one membrane layer.

The at least one membrane layer may comprise at least one polysilicon layer preferably formed by crystallizing at least one amorphous silicon layer. Silicon has good EUV transmissivity so is a suitable material for the at least one membrane layer. The at least one membrane layer may be coated with one or more materials which serves to provide additional chemical or thermal resistance, and/or which increase the emissivity of the membrane assembly.

The protective layer may comprise a cross-linked polymer. The polymer may be a poly(p-xylylene) polymer. The polymer may be Parylene or ProTek® type material.

According to a second aspect of the present invention, there is provided a membrane assembly for EUV lithography, the membrane assembly comprising:
  a membrane formed from at least one membrane layer comprising polycrystalline silicon or monocrystalline silicon; and
  a border holding the membrane;
  wherein the border region is formed from a planar substrate comprising an inner region and a border region around the inner region, wherein the border is formed by selectively removing the inner region of the planar substrate,
  wherein the planar substrate comprises a core layer and a sacrificial layer such that the border comprises the core layer and the sacrificial layer, wherein the sacrificial layer is between the core layer and the at least one membrane layer, wherein the etch rate of the core layer in an etchant and the at least one membrane layer is substantially different to the etch rate of the sacrificial layer in the etchant.

As described above, having a sacrificial layer which has a substantially different etch rate in an etchant to the etch rate in the etchant of the core layer and the at least one membrane layer reduces or prevents over-etching of the core layer and the at least one membrane layer, thereby reducing the risk of notch formation which results in a weakened membrane assembly.

The sacrificial layer may comprise a tensile material. As described above, the presence of a tensile sacrificial layer means that the membrane does not wrinkle during manufacture and therefore this further reduces possible weaknesses being introduced into the membrane assembly. Further, the internal stresses within the layers comprising the membrane assembly are more closely matched, resulting in less differential stresses being present in the membrane assembly, especially during use when the membrane assembly may be heated to a high temperature, such as 500° C. or even higher, causing stresses to build within the membrane assembly. The membrane assembly according to the present invention is believed to be more robust than other pellicles and can be made to a more consistent specification.

The sacrificial layer may comprise silicon nitride. Silicon nitride is a tensile material and therefore does not act to wrinkle the membrane assembly during manufacture. In addition, silicon nitride is resistant to certain etchants which are used to etch the planar substrate and its oxide, but it more rapidly etched with other etchants to which the planar substrate and its oxide are resistant. Thus, silicon nitride can be used to carefully manage the various etching steps used in the manufacture of a membrane assembly.

The core layer may comprise silicon. The at least one membrane layer may comprise silicon. Silicon has high EUV transmissivity and is a very well characterised and understood material.

The etch rate of the core layer and the at least one membrane layer is substantially less than the etch rate of the sacrificial layer. As explained above, this prevents or at least reduces the likelihood of damage caused to the membrane assembly by over-etching.

The etchant may comprise phosphoric acid. It will be appreciated that other etchants which etch the sacrificial layer at a much higher rate than the core layer and the at least one membrane layer may be used in any aspect of the present invention.

The membrane assembly may be for a patterning device or a dynamic gas lock.

According to a third aspect of the present invention, there is provided the use of a membrane assembly according to the second or fifth aspects of the present invention or manufactured according to the method of the first or sixth aspects of the present invention. The use may be in a lithographic apparatus. The use may be as a pellicle, a part of a dynamic gas lock, and/or as a spectral purity filter.

According to a fourth aspect of the present invention, there is provided a lithographic apparatus comprising a membrane assembly according to the second or fifth aspects of the present invention or manufactured according to the method of the first or sixth aspects of the present invention.

According to a fifth aspect of the present invention, there is provided an optical element for a lithographic apparatus, the optical element including a stack, wherein said stack includes a core, a capping layer, and an oxygen barrier layer between the capping layer and the core.

It has been found that during operation, the optical elements of a lithographic apparatus become oxidised. This limits the lifetime of the optical elements and reduces the availability of the lithography apparatus. It has been found that layers of the optical elements which are below the protective capping layer may become oxidised during operation. Without wishing to be bound by scientific theory, it is believed that water and oxygen present in the lithography apparatus are able to pass through the protective capping layer and react with one or more underlying layers. The one or more underlying layers may comprise an IR-suppression layer which loses its IR suppression capability when oxidised. The core layer, which may comprise silicon, may also become oxidised. The presence of an oxygen barrier layer, which may also be a water barrier layer, serves to protect the optical element from unwanted oxidation and consequential loss of performance.

The oxygen barrier layer may include at least one silicon oxide layer and at least one zirconium oxide or yttrium oxide layer.

The at least one silicon oxide layer acts as part of a barrier layer for oxygen and/or water in that it inhibits the passage of oxygen and/or water. The zirconium oxide or yttrium oxide may serve as both the capping layer and as part of the oxygen barrier layer.

The oxygen barrier layer may include a zirconium silicon oxide layer or a yttrium silicon oxide layer. The zirconium silicon oxide layer or yttrium silicon oxide may be disposed between a silicon oxide layer and a zirconium oxide layer or yttrium oxide layer as appropriate.

A silicon oxide layer and a zirconium oxide layer may form a zirconium silicon oxide layer therebetween. Similarly, a silicon oxide layer and a yttrium oxide layer may form a yttrium silicon oxide layer therebetween. It has been surprisingly found that the zirconium or yttrium silicon oxide layer provides advantageous oxygen barrier properties. It has also surprisingly been found that the thickness of a zirconium oxide layer overlying a silicon layer has only very minimal impact on the ability of the zirconium oxide layer to prevent oxidation of the underlying silicon layer. As such, without wishing to be bound by scientific theory, it is believed that it is the presence of an interlayer comprising zirconium silicon oxide or yttrium silicon oxide which acts as an oxygen barrier. As such, it has been found that an oxygen barrier may be provided without increasing the thickness of the optical element. As such, there is provided an optical element for lithography apparatus, wherein said optical element comprises a zirconium silicon oxide layer or a yttrium silicon oxide layer as an oxygen barrier.

Since it has been found that the thickness of the layers has a low impact on the resistance to oxidation provided, it has been realised that it is the number of interfaces or energy barriers which determines the growth rate of the underlying oxide layer. As such, the oxygen barrier may comprise a plurality of alternating material layers.

The alternating layers provide a number of interfaces between each layer which serve to inhibit the transfer of oxygen and/or water. The interfaces may be structural and/or energy barriers for oxygen and/or water to cross. In order for there to be interfaces, the materials of immediately adjacent layers need to be different. As such, the layers preferably alternate between different materials. It will be appreciated that two materials may alternate, but it will also be appreciated that there may be three or more different materials arranged to provide a plurality of interfaces.

The alternating material layers include silicon oxide, zirconium oxide, zirconium silicon oxide, zirconium nitride, yttrium oxide, silicon nitride, zirconium boride, aluminium oxide, aluminium nitride, titanium oxide, titanium nitride, tantalum oxide and tantalum nitride, preferably wherein the oxygen barrier layer comprises alternating layers of silicon oxide and zirconium oxide or alternating layers of silicon oxide and yttrium oxide.

The present application exemplifies oxygen barrier layers comprising alternating layers of silicon oxide and zirconium oxide. However, other materials may be used in the oxygen barrier layer of the present invention. The materials described above have been found to provide oxygen barrier capability and do not or only weakly absorb EUV radiation. As such, these materials have been found to be suitable for use in an optical element of a lithography apparatus, especially an EUV lithography apparatus. Since it is the presence of an interface between the material layers, these materials can be used in any combination. In addition, two or more materials may be selected to form the alternating material layers. Since the core layer may be conveniently composed of silicon, it is convenient to have silicon oxide as one of the materials forming the oxygen barrier as the silicon oxide can be readily formed during manufacture. It will be appreciated that the first to third aspects of the present invention are also applicable to the fourth aspect. In addition, since the capping layer may be zirconium oxide or yttrium oxide, it may be desirable to form the oxygen barrier from the same material. Indeed the capping layer itself may be considered as the first layer in the multilayer oxygen barrier.

The optical element may comprise an IR-suppression layer. The IR-suppression layer may include molybdenum, niobium, ruthenium, or combinations thereof. The IR-suppression layer may preferably comprise metallic molybdenum. This layer serves to increase the emissivity of the optical element and suppress unwanted IR radiation.

The core of the optical element preferably comprises two sides. Preferably, an oxygen barrier layer is disposed on both sides of the optical element. Preferably, the oxygen barrier layers are disposed between each side of the core and a respective capping layer on each side of the core. As such, in one embodiment, there is provided an optical element for a lithographic apparatus, the optical element including a stack wherein said stack includes a core, preferably comprising silicon, a capping layer comprising zirconium oxide or yttrium oxide on each side of the core, a silicon oxide layer on each side of the core disposed between the core and the respective capping layer, and a zirconium silicon oxide layer or yttrium silicon oxide layer disposed between the silicon oxide layer and the zirconium oxide layer or yttrium oxide layer on each side of the core. Preferably, an IR-suppression layer is disposed on one side of the core, although an IR-suppression layer may be provided on both sides of the core.

The optical element may include a pellicle, a mirror, a dynamic gas lock or any other element within a lithographic apparatus with which the lithographic radiation interacts.

The oxygen barrier layer may comprise alternating material layers of from about 0.1 to about 2 nm in thickness each. Since it has been surprisingly realised that the thickness of the layers is less important than the presence of interfaces between the layers, this allows the layers to be thinner than would previously have been expected and offers a new way of mitigating oxidation whilst maintaining good optical properties, especially for use in a lithography apparatus, preferably EUV lithography apparatus.

According to a sixth aspect of the present invention, there is provided a method of manufacturing an optical element for a lithography apparatus, said method comprising:

providing a core;
providing a first material on one or both sides of the core;
providing a second material with or on the first material, said first and second materials forming an oxygen barrier layer,
wherein the first and second materials are not the same and are selected from: silicon oxide, zirconium oxide, zirconium silicon oxide, zirconium nitride, silicon nitride, yttrium oxide, zirconium boride, aluminium oxide, aluminium nitride, titanium oxide, titanium nitride, tantalum oxide and tantalum nitride, preferably wherein one of the first and second materials is silicon oxide and the other is zirconium oxide or yttrium oxide.

As explained above, it has been surprisingly realised that it is possible to provide an oxygen barrier layer comprising a plurality of alternating thin layers and that it is the interfaces between the layers which provide the necessary physical and/or energetic barriers to oxygen diffusion through the material. The provision of a multilayer oxygen barrier layer allows the individual layers to be relatively thin, from around 0.1 nm to about 2 nm in thickness, which avoids or reduces any decrease in the transmissivity of the optical element, in contrast to simply increasing the thickness of the capping layer, which has been found to have little correlation with the reduction of oxidation of underlying layers.

The method may comprise providing one or more IR-suppression layers prior to depositing the first material. The IR-suppression layer is preferably provided on the core such that it is disposed between the core and the oxygen barrier layer. In this way, the oxygen barrier layer prevents or reduces oxidation of the IR-suppression layer. It will also be appreciated that the core is also protected from oxidation by the oxygen barrier layer.

The steps of depositing the first material and the second material may be repeated at least once to form an oxygen barrier comprising a plurality of layers. As mentioned, since the interface between layers is believed to provide the desired oxygen barrier characteristics, provision of multiple layers results in an increase in the number of interfaces and physical/energetic barriers for oxygen to pass through.

The steps of providing a first material and providing a second material may be repeated from 2 to 10 times. The exact number of times this step is repeated will depend on the number of layers which are desired to be provided. It will be appreciated that this step may be repeated more than ten times if required and that the present invention is not particularly limited by the exact number of layers. As such, a third material may also be included in the formation of the oxygen barrier. Further materials may also be present.

The first and/or second materials may be provided by physical vapour deposition (PVD), reactive sputtering, co-sputtering, atomic layer deposition (ALD), plasma-enhanced ALD, thermal oxidation, or wet chemical passivation, or any other suitable deposition technique. The invention is not particularly limited to the technique used to provide the various layers of the optical element and any suitable technique may be used.

It will be appreciated that features described in respect of one embodiment may be combined with any features described in respect of another embodiment and all such combinations are expressly considered and disclosed herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
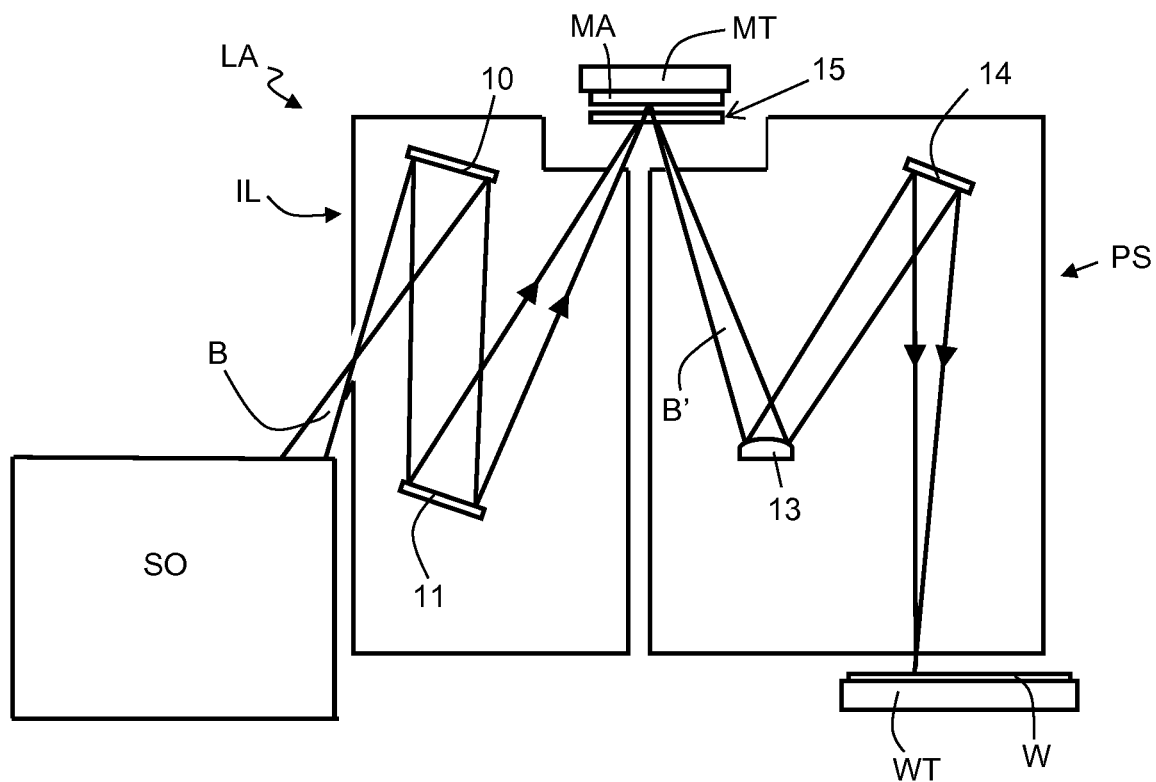
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

FIG. 1 shows a lithographic system including a pellicle 15 (also referred to as a membrane assembly) according to the second aspect of the present invention or manufactured according to the method of the first aspect of the present invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B' (now patterned by the mask MA) onto the substrate W. The substrate W may include previously formed patterns. Where this is the case, the lithographic apparatus aligns the patterned radiation beam B' with a pattern previously formed on the substrate W. In this embodiment, the pellicle 15 is depicted in the path of the radiation and protecting the patterning device MA. It will be appreciated that the pellicle 15 may be located in any required position and may be used to protect any of the mirrors in the lithographic apparatus.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source. A laser, which may for example be a $CO_2$ laser, is arranged to deposit energy via a laser beam into a fuel, such as tin (Sn) which is provided from a fuel emitter. Although tin is referred to in the following description, any suitable fuel may be used. The fuel may for example be in liquid form, and may for example be a metal or alloy. The fuel emitter may comprise a nozzle configured to direct tin, e.g. in the form of droplets, along a trajectory towards a plasma formation region. The laser beam is incident upon the tin at the plasma formation region. The deposition of laser energy into the tin creates a plasma at the plasma formation region. Radiation, including EUV radiation, is emitted from the plasma during de-excitation and recombination of ions of the plasma.

The EUV radiation is collected and focused by a near normal incidence radiation collector (sometimes referred to more generally as a normal incidence radiation collector). The collector may have a multilayer structure which is arranged to reflect EUV radiation (e.g. EUV radiation having a desired wavelength such as 13.5 nm). The collector may have an elliptical configuration, having two ellipse focal points. A first focal point may be at the plasma formation region, and a second focal point may be at an intermediate focus, as discussed below.

The laser may be separated from the radiation source SO. Where this is the case, the laser beam may be passed from the laser to the radiation source SO with the aid of a beam delivery system (not shown) comprising, for example, suitable directing mirrors and/or a beam expander, and/or other optics. The laser and the radiation source SO may together be considered to be a radiation system.

Radiation that is reflected by the collector forms a radiation beam B. The radiation beam B is focused at a point to form an image of the plasma formation region, which acts as a virtual radiation source for the illumination system IL. The point at which the radiation beam B is focused may be referred to as the intermediate focus. The radiation source SO is arranged such that the intermediate focus is located at or near to an opening in an enclosing structure of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B' enters the projection system PS. The projection system comprises a plurality of mirrors 13, 14 which are configured to project the radiation beam B' onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

In an embodiment the membrane assembly 15 is for a dynamic gas lock. In this case the membrane assembly 15 functions as a filter for filtering DUV radiation. Additionally or alternatively, in an embodiment the membrane assembly 15 is a pellicle for the patterning device MA for EUV lithography. The membrane assembly 15 of the present invention can be used for a dynamic gas lock or for a pellicle or for another purpose. In an embodiment the membrane assembly 15 comprises a membrane formed from the at least one membrane layer configured to transmit at least 90% of incident EUV radiation. In order to ensure maximised EUV transmission and minimized impact on imaging performance it is preferred that the membrane is only supported at the border.

If the patterning device MA is left unprotected, the contamination can require the patterning device MA to be cleaned or discarded. Cleaning the patterning device MA interrupts valuable manufacturing time and discarding the patterning device MA is costly. Replacing the patterning device MA also interrupts valuable manufacturing time.

FIGS. 2 to 9 schematically depict stages of a method for manufacturing a membrane assembly 15 according to the present invention.

Figure 2:
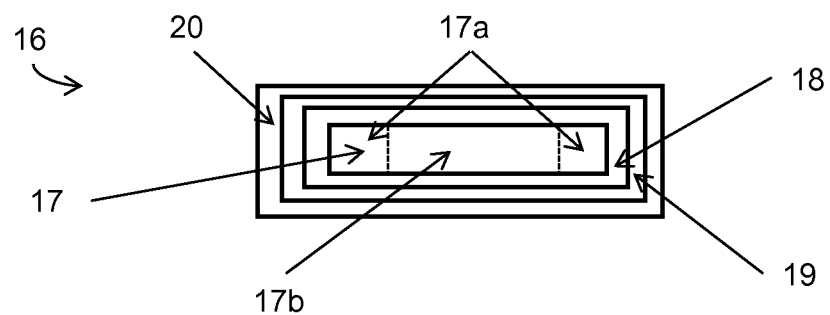
FIGS. 2 to 9 schematically depict stages of a method for manufacturing a pellicle according to the present invention.

FIG. 2 depicts a stack 16 comprising a membrane layer 19 supported on a planar substrate 17. In the depicted embodiment, a single membrane layer 19 is shown, but it will be appreciated that there may be more than one membrane layer present. The planar substrate 17 comprises an inner region 17b and a border region 17a. The dotted line schematically delimits the inner region 17b from the border region 17a, but it will be appreciated that the exact relative dimensions of the inner and border regions 17b, 17a can be varied as required. Further, since FIG. 2 depicts a cross section through the stack 16, it should also be appreciated that the border region 17a preferably forms a continuous ring around the inner region 17b. The stack further comprises a first sacrificial layer 18 disposed on the planar substrate 17. The first sacrificial layer 18 is depicted as completely surrounding the planar substrate 17, but in some embodiments, the first sacrificial layer 18 may only partially surround the planar substrate 17. The planar substrate 17 may comprise a thin oxide layer on its surface, but it is preferred that the planar substrate 17 is substantially free of an oxide layer. In an embodiment, the planar substrate 17 is a SOI (silicon on insulator) substrate. In such a SOI substrate, a pair of Si layer may be separated by an insulator layer, e.g. a SiO$_2$ layer. In such embodiment, typical dimensions of the Si layers and the insulator layer may e.g. be 500 μm or more for the bottom Si layer, 1 μm or less for the insulator layer and 30 μm or less for the top Si layer. By using an SOI substrate rather than a Si substrate, the adverse effects of over-etching may be further reduced, as will be illustrated below.

The stack also comprises a membrane layer 19 disposed on the first sacrificial layer 18. Again, the membrane layer 19 is depicted as surrounding the first sacrificial layer 18, but in alternative embodiments, the membrane layer 19 may only partially surround the first sacrificial layer 18 or be deposited on one face of the stack 16.

The stack also comprises a second sacrificial layer 20. The second sacrificial layer 20 surrounds the membrane layer 19, but in alternative embodiments, the second sacrificial layer may only partially surround the membrane layer 19. In one embodiment, the second sacrificial layer 20 does not extend over the lower or rear face of the membrane layer 19. The lower or rear face of the stack is the face as shown at the bottom of the figures and the upper or front face of the stack is the face as shown at the top of the figures.

In an embodiment of the present invention, the second sacrificial layer comprises tetraethyl orthosilicate (TEOS). In an embodiment, the second sacrificial layer can be applied to the stack by means of chemical vapour deposition (CVD) or the like. In such embodiment, the step of applying the sacrificial layer is e.g. followed by an annealing step. Alternatively, in such embodiment, the annealing step may be applied before depositing the second sacrificial layer. In an embodiment of the present invention, Boro-silicate TEOS (B-TEOS) is applied rather than TEOS. In such embodiment, the annealing step is applied after the deposition of second sacrificial layer. When boron containing TEOS, e.g. containing 4-8% boron is used instead of TEOS, the membrane layer 19 will become doped with boron during the annealing step, resulting in a doped membrane layer 19. By such doping of the membrane layer with boron, the membrane layer 19 can be made more etch resistant, resulting in an increased yield of the manufacturing process of the membranes, e.g. the manufacturing process as illustrated below. The doping of the membrane layer 19 may also result in an increased strength of the membrane as manufactured.

The stack may also comprise several other layers of materials deposited on the planar substrate 17, the layers having various protective functions in the manufacturing process of the membrane assembly 15, or for enhancement of the characteristics of the membrane assembly 15, such as resistance to chemicals/environment and/or improved (thermo-)mechanical strength and/or reduced imaging impact (e.g. by reducing pellicle reflections).

In an embodiment the planar substrate 17 is formed from silicon. The planar substrate 17 has a shape such as a square, a circle or a rectangle, for example. The shape of the planar substrate 17 is not particularly limited. The size of the planar substrate 17 is not particularly limited.

Silicon can crystallise in a diamond cubic crystal structure. In an embodiment the planar substrate 17 comprises a cubic crystal of silicon. In an embodiment the planar substrate 17 has a <100> crystallographic direction.

Part of the planar substrate 17 referred further herein as a border region 17a forms (after removal of an inner region of the planar substrate) part of a border of the membrane assembly 15. The border 17a holds the membrane 19 of the membrane assembly 15.

The membrane layer 19 may comprise polycrystalline silicon (pSi). In an embodiment the polycrystalline silicon is formed by crystallising amorphous silicon in the at least one membrane layer 19. For example, in an embodiment a membrane layer 19 is added to the stack 16 as an amorphous silicon layer. The amorphous silicon layer crystallizes into a polycrystalline silicon layer when temperature increases.

Alternatively, the membrane layer 19 as applied in the present invention can comprise $MoSi_2$ or $MoSiN_x$.

Figure 3:
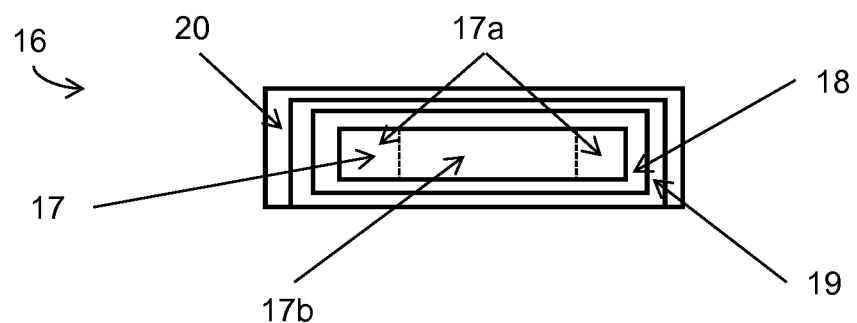

FIG. 3 depicts stack 16 after a step in which the lower face of the stack 16 has had the second sacrificial layer 20 removed. This step is optional and may not be necessary where the initial stack 16 is provided without a second sacrificial layer on the lower face. The second sacrificial layer 20 may be removed by any suitable means and the method of the present invention is not particularly limited by the particular method used.

Figure 4:
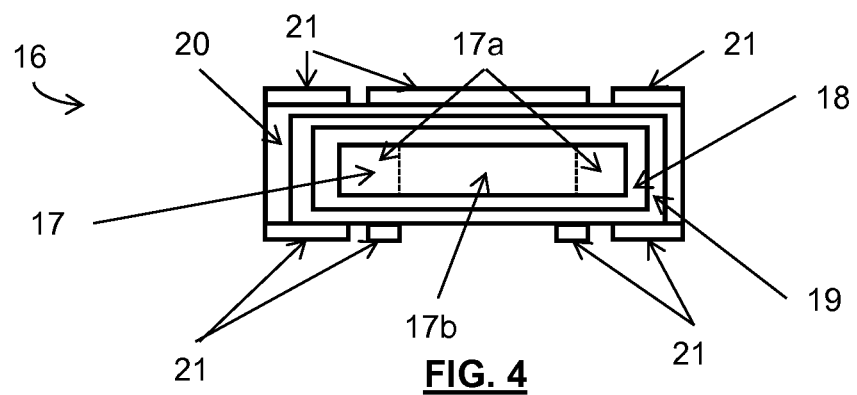

FIG. 4 depicts a further step in the method in which a resist 21 is applied to the stack 16. The resist 21 may be a positive or negative resist and the method is not particularly limited by which resist is used. The resist is patterned in order to define the portions of the stack 16 which will be etched in the subsequent etching step.

Figure 5:
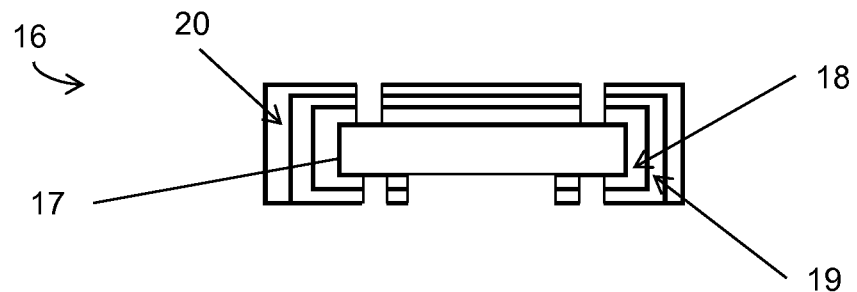

The stack 16 may then be etched by any suitable etching means to remove a portion of the second sacrificial layer 20, the membrane layer 19, and the first sacrificial layer 18 which are not protected by the resist 21. Again, the present invention is not particularly limited to the etching means used in this step and any suitable means may be used. FIG. 5 shows the stack 16 after the first etching step and after removal of the resist.

Figure 6:
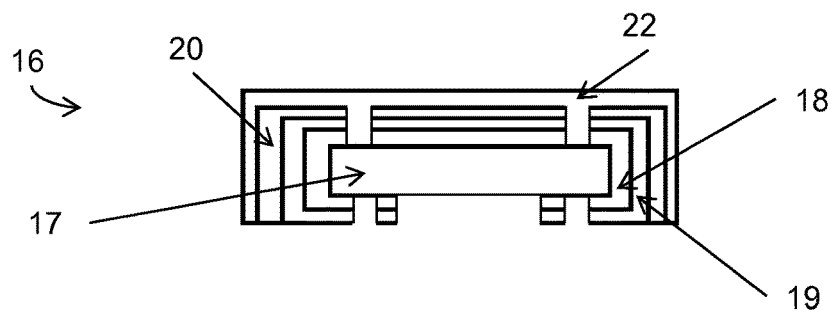

As shown in FIG. 6, a protective layer 22 is then added to the front side of the stack 16 in order to protect the layers at the front side of the stack 16 from a subsequent etching step. The protective layer 22 may comprise a cross-linked poly (p-xylylene) polymer. For example, Parylene C may be pinhole free for a layer thickness as small as about 600 nm. The protective layer 22 is applied as a continuous layer that is substantially free from holes such that it provides a layer which is impermeable to the etchant. The protective layer 22 is not added to the rear side of the stack 16 such that the etchant is able to access the planar substrate 17 as well as any membrane layer 19 situated on the rear side of the stack 16.

Figure 7:
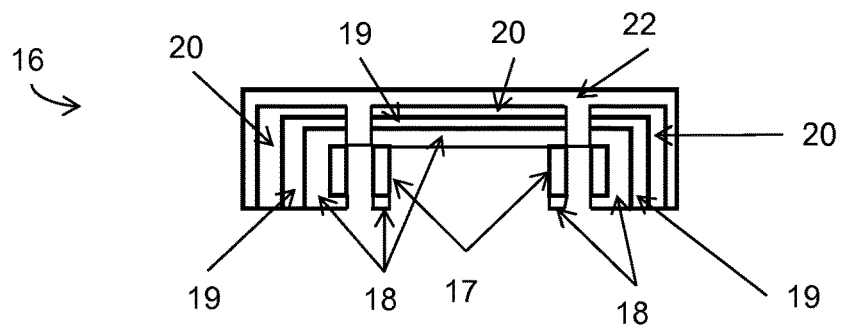

FIG. 7 depicts the stack 16 after a bulk etching step of the inner region 17b of the planar substrate 17. In the depicted example, wet anisotropic etching using tetramethylammonium hydroxide (TMAH) may be used to etch away the remaining membrane layer 19 as well as the inner region 17b of the planar substrate 17, although it will be appreciated that any suitable etchant may be used which etches silicon at a substantially greater rate than silicon nitride. TMAH has a substantially negligible etch rate on silicon nitride, so the silicon planar substrate 17 and membrane layer 19 are etched with a strong preference. Again, it will be appreciated that other etchants may be used and the key consideration is that the selected etchant strongly preferentially etches the material of the planar substrate 17 and the membrane layer 19 rather than the first sacrificial layer 18. It will be seen from FIG. 7 that a membrane assembly 15 has now been substantially defined.

In an embodiment of the present invention, the planar substrate 17 is an SOI substrate including a bottom Si layer, a top Si layer and an insulator layer, e.g. an SiO2 layer, arranged between the bottom Si layer and the top Si layer. In such an arrangement, the bulk etching step illustrated in FIG. 7 may be replaced by three consecutive etching steps:
In a first etching step, the bottom Si layer may be removed, e.g. using TMAH as etchant.
In a second etching step, the insulator layer that is buried in between both Si layer can be etched away, e.g. by means of Buffered Oxide Etching (BOE). It can be pointed out that any over-etching in the buried oxide layer would not affect the top Si layer because Si etches much slower in BOE than an oxide does in TMAH.
In a third etching step, a shorter TMAH etching can be done to remove the thinner top layer of Si. Because the third etching step can be much shorter than the first etching step any over-etching effects on the sacrificial layer 18 will be much smaller compared to the effects of the bulk etching step illustrated in FIG. 7. As a consequence, the sacrificial layer 18 can be made much thinner Typically, a TOX layer having a thickness in the range of e.g. 150 nm thickness or less, such as from 5 to 100 nm TOX layer, could be applied as the first sacrificial layer 18. When applied to an SOI substrate and applying the above described three-step etching process, a TOX layer having a thickness in the range of e.g. 20 nm or less, such as from 1 to 15 nm, can be applied instead of a 100 nm layer. As an alternative to a TOX layer as the sacrificial layer 18, a SiN layer may also be applied. Such a SiN layer may e.g. have a thickness of approx. 10 nm or less, such as from 1 to 5 nm. Note that SiN may also be used as an alternative to TEOS or B-TEOS as an sacrificial layer. In an embodiment, the top Si layer and bottom Si layer of the SOI substrate can be made from cSi.

Figure 8:
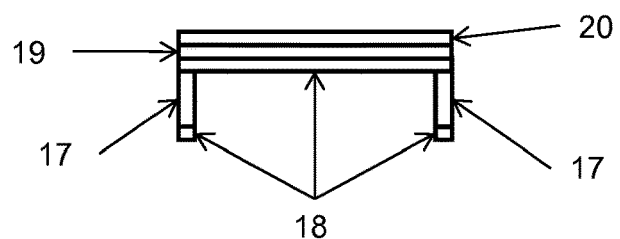

FIG. 8 depicts the stack 16 once the protective layer 22 has been removed. Since the second sacrificial layer 20 was protected by the protective layer 22, the next step is the method of the removal of the second sacrificial layer 20 from the stack 16. In this etching step, the etchant is selected such that it preferentially etches the material of the second sacrificial layer 20 over the material of the membrane layer 19 and the planar substrate 17. In an example, the etchant comprises phosphoric acid as this etches silicon nitride at a rate of around 5 nm/min, whereas it etches silicon oxides, silicon and TEOS at rates of around 0.2 nm/min. As such, the etchant etches the second sacrificial layer around 25 times more quickly than the other layers. In addition, the etchant etches silicon and its oxides at substantially the same rate. Since polysilicon oxidises after deposition, silicon dioxide is formed which may migrate into grain boundaries. In cases where the etchant etches both silicon and its oxide at substantially the same rate, in cases where the stack is exposed to the etchant for too long, the etchant may preferentially etch the silicon oxide thereby forming notches in the surface, causes points of weakness. Again, it will be appreciated that any etchant which etches the material of the planar substrate 17 and the material of the membrane layer 19 as well as the oxides thereof at substantially the same rate, and at a rate which is substantially less than the rate at which the etchant etches the material of the first sacrificial layer may be used.

Figure 9:
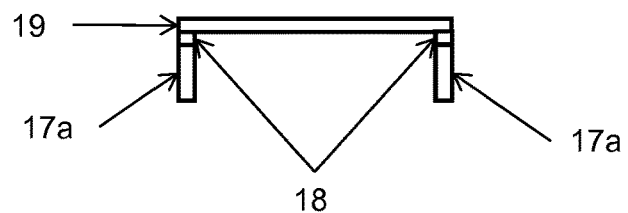

FIG. 9 depicts a membrane assembly 15 comprises a frame comprising the border region 17a of the planar substrate 17, a layer of the first sacrificial layer 18, and a membrane layer 19, wherein the first sacrificial layer 18 is disposed between the border region 17a and the membrane layer 19.

Figure 10A:
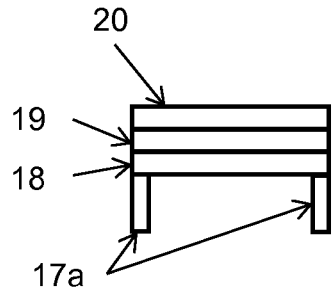
FIG. 10 depicts a comparison between an assembly according to the present invention and another assembly.
Figure 10B:
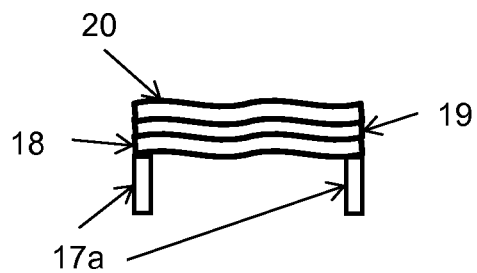

FIGS. 10a and 10b depict a comparison of a membrane assembly 15 according to the present invention versus a membrane assembly of another method, prior to the final etching step. Both assemblies still comprise an upper sacrificial layer, but this may be removed to provide the final membrane assembly. The same reference numerals are used for equivalent features for the sake of clarity. The assembly of FIG. 10a depicts a cross section of an assembly according to an embodiment of the present invention. On the border region 17a there is a first tensile sacrificial layer 18. On top of this is a membrane layer 19, which is itself tensile, and on top of the membrane layer 19 is a tensile second sacrificial layer 20. Since both the first and second sacrificial layers 18, 20 are tensile, the resultant stack is not wrinkled and is substantially planar. In contrast, FIG. 10b depicts an assembly in which the first and second sacrificial layers 18, 20 are compressive, and in which the membrane layer 19 is tensile. Due to the difference in the compressive/tensile nature of the layers used, the resultant stack is wrinkled. The wrinkling can lead to the membrane assembly being weakened compared to the membrane assembly of the present invention.

In order to investigate the advantages of the present invention, tests were run in which membrane assemblies of the present invention were over-etched for 10 minutes and their physical properties investigated. Each of the assemblies had EUV transmissivity of in excess of 92%, which is within the desired range of transmissivity for EUV applications. In addition, the strength of the membrane assemblies produced according to the present invention were higher than assemblies produced according to previous methods. Furthermore, the strength of the membrane assemblies produced was highly consistent and no samples were produced which were considerably weaker than the others. The method according to the present invention is also faster than previous methods, resulting in around a 40% cycle time reduction and keep the stack in a tensile state at all stages of the process, preventing folding induced damage to the film during production. The problem of notch formation due to over etching is also addressed and stronger membranes are formed. Due to the ability to produce stronger membranes more reliably and consistently, it may be possible to make the membrane layer even thinner, resulting in improved EUV transmissivity. Finally, since the membranes produced according to the present invention comprise tensile layers, there is a degree of pre-tension in the ultimate membrane assembly, which may allow for further thinning of the membrane layer without wrinkling or over-weakening of the assembly.

Figure 11:
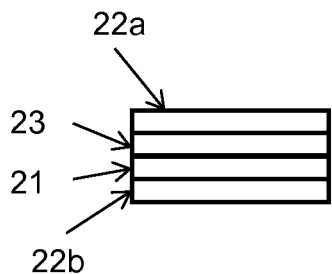
FIG. 11 schematically depicts a cross-section through a stack which does not include an oxygen barrier layer as described herein.

FIG. 11 depicts a schematic cross-section through a stack. The stack comprises a core 21, an IR-suppression layer 23, and a capping layer 22a, 22b on each side of the core 21. The core 21 may be silicon, preferably p-silicon. It has been found that a stack having the structure in FIG. 11 is susceptible to the IR-suppression layer 23 and/or the core 21 becoming oxidised during use in a lithography apparatus, in particular an EUV lithography apparatus. The thickness of the capping layer 22a, 22b is generally greater than around 2 nm. The capping layer may comprise a metal oxide.

Figure 12:
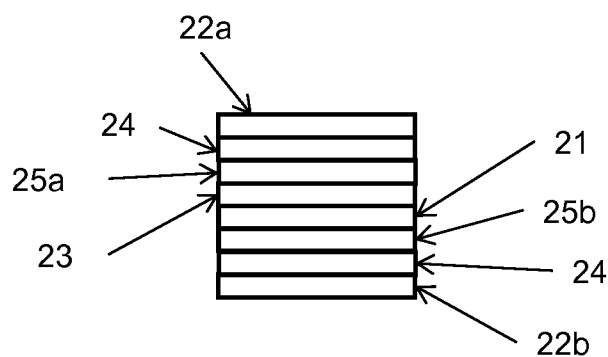
FIG. 12 schematically depicts a cross-section through a stack according to an embodiment of the present invention.

FIG. 12 depicts a schematic cross-section through a stack according to an embodiment of the present invention. As with the stack of FIG. 11, the stack comprises a core 21, preferably comprising p-silicon, and an IR-suppression layer 23 on one side of the core 21, although it will be appreciated that an IR-suppression layer could be provided on the other side of the core 21 or indeed on both sides of the core 21. In this embodiment, the IR-suppression layer comprises metallic molybdenum, but it may comprise ruthenium or niobium. In some cases, the IR-suppression layer 23 may be absent. The stack also includes silicon oxide layers 25a, 25b on each side of the core 21. The stack also includes capping layers 22a, 22b, which in the depicted embodiment comprise zirconium oxide, but which may comprise yttrium oxide or another suitable capping layer material. Between the silicon oxide layers 25a, 25b, and the capping layers 22a, 22b, there is an interlayer 24. The interlayer 24 in the depicted embodiment comprises zirconium silicon oxide, but it will be appreciated that the nature of the interlayer will depend on the materials which form the interlayer. The addition of the silicon oxide layer and the zirconium silicon oxide layer result in the presence of a barrier which hinders the diffusion of oxygen and water through the stack and thereby protects the underlying IR-suppression 23 and core 21 layers from oxidation. The silicon oxide layer may be from around 0.1 to around 3 nm in thickness. The capping layer may be around 0.1 to around 2 nm in thickness. The interlayer may be around 0.1 to 2 nm in thickness.

Figure 13:
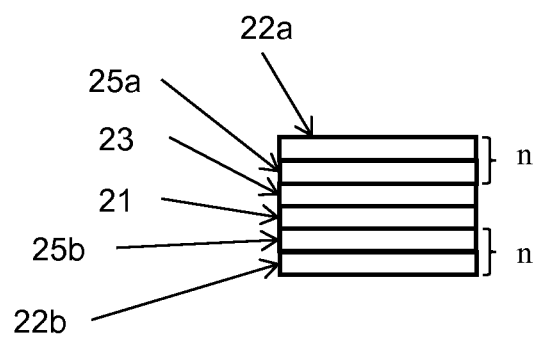
FIG. 13 schematically depicts a cross-section through a stack according to an embodiment of the present invention.

FIG. 13 depicts a schematic cross-section through a stack according to an embodiment of the present invention. Similar to the stack in FIG. 12, the stack of FIG. 13 is provided with silicon oxide layers 25a, 25b adjacent the capping layers 22a, 22b. Since it has been surprisingly realised that the thickness of the capping layer is not strongly correlated to the effectiveness of the capping layer as an oxygen barrier, the presence of a plurality of alternating material layers has been found to provide desirable oxygen barrier characteristics. For example, it has been found that simply doubling the thickness of the capping layer has no appreciable effect on the oxidation of an underlying silicon layer. Of course, a significantly thicker capping layer could reduce or halt oxidation of underlying layers, but this would result in an optical element which is no longer suitable for use in a lithography apparatus, for example, the transmissivity of a pellicle would be decreased to below an acceptable level. The interlayer between the zirconium oxide capping layers and the silicon oxide layers is not shown, but it will be appreciated that an interfacial layer will be formed between adjacent layers. A number, n, of layers of materials can be provided to form an oxygen barrier layer and n can be any number between 1 and 10, although it will be appreciated that the invention is not particularly limited to ten alternating layers and any suitable number can be selected that provides sufficient protection from oxidation and optical properties for use in a lithography apparatus. Whilst the depicted embodiment indicates that two materials are used in the multilayer oxygen barrier, more than two materials may be used.

As will be appreciated, the embodiment shown in FIG. 12 has a single interface between layers and FIG. 13 depicts an embodiment where there is a plurality of interfaces. Alternating thin layers (from about 0.1 to about 2 nm) of different materials results in a number of interfaces which act as oxygen barriers and since the layers comprising the oxygen barrier layer are thin, the reduction in transmissivity of the stack is mitigated.

In an embodiment of the present invention, the stack comprises a core layer of p-silicon, e.g. a core layer having a thickness of 30 to 60 nm, preferably approx. 40 nm. The stack may further comprise a Ruthenium based capping layer. Such a Ru based capping layer may e.g. be realised by applying a Molybdenum layer onto the core layer and applying a Ru based layer by means of sputtering, e.g. DC sputtering, onto the Mo layer. In such an embodiment, a Mo layer having a thickness of 3 to 5 nm may e.g. be applied onto the core layer and a Ru layer of approx. the same thickness, e.g. ranging from 3 to 5 nm can be applied on the Mo layer. In such an arrangement, a Ru/Mo intermixing layer will be realised at the interface of the Mo layer and the Ru layer. Such an intermixing layer will be amorphous and will be a good barrier layer with a high crystalline-transformation temperature. In order to withstand higher EUV powers during use, the applied Ru can be alloyed with Mo, Nb, Ta, Ti or Zr. In an embodiment, the capping layer as applied can be a multi-layer structure having multiple Ru/Mo interface layers or multiple Ru/Mo intermixing layer. Such an embodiment can e.g. be realised by alternatingly applying Mo layers and Ru layers on the core layer. Such a stack may e.g. comprise the following layer sequence: pSi-Mo—Ru—Mo—Ru. At each interface between a Mo layer and a Ru layer, a Ru/Mo intermixing layer will be generated, resulting in the following layer sequence: pSi-Mo—Ru/Mo intermixing—Ru—Ru/Mo intermixing—Mo—Ru/Mo intermixing—Ru. In such embodiment, due to the use of multiple Mo and Ru layers, the thickness of the applied layers can be reduced. Such a multilayer capping layer with thinner capping layers, e.g. compared to Mo and/or Ru layers having a thickness of 3-5 nm, will have a more amorphous structure, which will enable improved barrier properties. In particular, a diffusion of Mo through the Ru layer resulting in an oxidation of the Mo at the surface can be avoided or mitigated. In this respect, it can be pointed out that a Ru layer having a thickness of 3-5 nm will typically be crystalline or semi-crystalline. It has been observed that the crystallinity of Ru may be a limiting factor for being a good barrier member. The application of multiple Ru layers having a more amorphous structure may thus provide an improved barrier layer. The multi-layer structure having the multiple Ru/Mo interfaces may directly be applied onto a pSi core layer. Alternatively, the pSi core layer may be enclosed by a SiO$_2$ layer or a SiON layer onto which the multi-layer structure having the multiple Ru/Mo interfaces is applied.

The layers provided are not particularly limited by the method by which they are provided and any suitable method may be used. For example, the silicon oxide layer can be deposited by PVD from a silicon oxide target, or by reactive sputtering from a silicon target or by atomic layer deposition methods. Wet chemical passivation of a p-Si core or thermal oxidation of a p-Si core may be used to provide a silicon oxide layer. Similarly, zirconium oxide or yttrium oxide, or indeed any of the other suitable materials disclosed herein, may be provided by similar techniques, including but not limited to PVD, sputtering, or ALD.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the various layers may be replaced by other layers that perform the same function.

The descriptions above are intended to be illustrative, not limiting. Thus it will be apparent to one skilled in the art that modifications may be made to the invention as described without departing from the scope of the claims and clauses set out below.

1. A method for manufacturing a membrane assembly for EUV lithography, the method comprising:
   i) providing a stack comprising:
      at least one membrane layer supported by a planar substrate, wherein the planar substrate comprises an inner region and a border region around the inner region; and a first sacrificial layer between the planar substrate and the membrane layer;
   ii) selectively removing the inner region of the planar substrate, wherein the step of selectively removing the inner region of the planar substrate comprises using an etchant which has a similar etch rate for the membrane layer and its oxide and a substantially different etch rate for the first sacrificial layer;
   such that the membrane assembly comprises: a membrane formed from the at least one membrane layer; and a border holding the membrane, the border comprising the border region of the planar substrate and the first sacrificial layer situated between the border and the membrane layer.

2. A method according to Clause 1, wherein the first sacrificial layer is a tensile layer.

3. A method according to Clause 1 or 2, wherein the stack further comprises a second sacrificial layer on the at least one membrane layer.

4. A method according to any of Clauses 1 to 3, wherein the method comprises removing at least a portion of the second sacrificial layer from at least one face of the stack prior to step ii).

5. The method according to any of Clauses 1 to 4, wherein the method further comprises providing a resist on the stack and patterning the resist prior to step ii).

6. The method of Clause 5, wherein the method further comprises etching at least a portion of the second sacrificial layer, the membrane and the first sacrificial layer prior to step ii).

7. The method of Clause 6, wherein prior to step ii) the method further comprises applying a protective layer to a front side of the stack to protect the layers at the front side of the stack from a subsequent etching step.

8. The method of Clause 7, wherein the method further comprises removing the protective layer from the stack.

9. The method of Clause 8, wherein the method further comprises removing any remaining second sacrificial layer from the upper surface of the at least one membrane layer.

10. The method of any preceding clause, wherein the planar substrate is a wafer, optionally a silicon wafer, and/or wherein at least one of the first and second sacrificial layers comprises silicon nitride, and/or wherein the at least one membrane layer comprises at least one polycrystalline silicon layer preferably formed by crystallizing at least one amorphous silicon layer, and/or where the protective layer comprises a cross-linked polymer, preferably a poly(p-xylylene) polymer, preferably a Parylene or ProTEK® type material.

11. The method according to any preceding clause, wherein the step of removing any remaining second sacrificial layer from the upper surface of the at least one membrane layer comprises etching using an etchant which has an etch rate for the second sacrificial layer which is substantially higher than the etch rate versus the at least one membrane layer and its oxide.

12. The method according to Clause 11, wherein the etchant comprises phosphoric acid.

13. A membrane assembly for EUV lithography, the membrane assembly comprising:
   a membrane formed from at least one membrane layer comprising polycrystalline silicon or monocrystalline silicon; and
   a border holding the membrane;
   wherein the border region is formed from a planar substrate comprising an inner region and a border region around the inner region, wherein the border is formed by selectively removing the inner region of the planar substrate,
   wherein the planar substrate comprises a core layer and a sacrificial layer such that the border comprises the core layer and the sacrificial layer, wherein the sacrificial layer is between the core layer and the at least one membrane layer,
   wherein the etch rate of a etchant of the core layer and the at least one membrane layer is substantially different to the etch rate of the etchant of the sacrificial layer.

14. The membrane assembly of Clause 13, wherein the sacrificial layer comprises a tensile material.
15. The membrane assembly of Clause 13 or 14, wherein the sacrificial layer comprises silicon nitride.
16. The membrane assembly of Clauses 13 to 15, wherein the core layer comprises silicon.
17. The membrane assembly of any of Clauses 13 to 16, wherein the core layer and the at least one membrane layer comprise silicon.
18. The membrane assembly of any of Clauses 13 to 17, wherein the etch rate of the core layer and the at least one membrane layer is substantially less than the etch rate of the sacrificial layer.
19. The membrane assembly of Clause 18, wherein the etchant comprises phosphoric acid.
20. The membrane assembly of any of Clauses 13 to 19, wherein the membrane assembly is for a patterning device or a dynamic gas lock.
21. The membrane assembly of any of Clauses 13 to 20, wherein the membrane assembly comprises a Ruthenium based capping layer.
22. The membrane assembly of Clause 21, wherein the Ruthenium based capping layer is arranged on a Molybdenum layer.
23. The membrane assembly of Clause 22, wherein the Molybdenum layer is arranged on the core layer.
24. The membrane assembly of Clause 22 or 23, further comprising a Ru/Mo intermixing layer at an interface of the Molybdenum layer and the Ruthenium based capping layer.
25. The membrane assembly of clause 24, further comprising multiple Ru/Mo intermixing layers.
26. Use of a membrane assembly manufactured according to the method of any of Clauses 1 to 12 or according to any of Clauses 13 to 25 or an optical element according to any of Clauses 28 to 37 in a lithographic apparatus, preferably an EUV lithography apparatus.
27. A lithographic apparatus comprising a membrane assembly manufactured according to the method of any of Clauses 1 to 12 or a membrane assembly according to any of Clauses 13 to 25 or an optical element according to any of Clauses 28 to 37 or manufactured according to the method of Clauses 38 to 42.
28. An optical element for a lithographic apparatus, the optical element including a stack, wherein said stack includes a core, a capping layer, and an oxygen barrier layer between the capping layer and the core.
29. An optical element according to Clause 28, wherein the oxygen barrier layer includes at least one silicon oxide layer and at least one zirconium oxide or yttrium oxide layer.
30. An optical element according to Clause 28 or 29, wherein the oxygen barrier layer includes a zirconium silicon oxide layer or a yttrium silicon oxide layer.
31. An optical element according to Clause 30, wherein the zirconium silicon oxide layer or yttrium silicon oxide layer is disposed between a silicon oxide layer and a zirconium oxide layer or yttrium silicon oxide layer.
32. An optical element according to any of Clauses 28 to 31, wherein the oxygen barrier layer comprises a plurality of alternating material layers.
33. An optical element according to Clause 32, where the alternating material layers include silicon oxide, zirconium oxide, zirconium silicon oxide, zirconium nitride, silicon nitride, yttrium oxide, zirconium boride, aluminium oxide, aluminium nitride, titanium oxide, titanium nitride, tantalum oxide and tantalum nitride, preferably wherein the oxygen barrier layer comprises alternating layers of silicon oxide and zirconium oxide or yttrium oxide.
34. An optical element according to any of Clauses 28 to 33, wherein the optical element also includes an IR-suppression layer, preferably wherein the IR-suppression layer includes molybdenum, niobium, ruthenium, or combinations thereof.
35. An optical element according to any of Clauses 28 to 34, wherein the core comprises two sides, and wherein an oxygen barrier is disposed between each side of the core and a respective capping layer on each side of the core.
36. An optical element according to any of Clauses 28 to 35, wherein the optical element includes a pellicle, a mirror, a dynamic gas lock, or any other element within a lithographic apparatus with which the lithographic radiation interacts.
37. An optical element according to any of Clauses 32 to 36, wherein the oxygen barrier layer comprises alternating material layers of from about 0.1 to about 2 nm in thickness.
38. A method of manufacturing an optical element for a lithography apparatus, said method comprising:
providing a core;
providing a first material on one or both sides of the core;
providing a second material with or on the first material, said first and second materials forming an oxygen barrier layer,
wherein the first and second materials are not the same and are selected from: silicon oxide, zirconium oxide, zirconium silicon oxide, silicon nitride, zirconium nitride, yttrium oxide, zirconium boride, aluminium oxide, aluminium nitride, titanium oxide, titanium nitride, tantalum oxide and tantalum nitride, preferably wherein one of the first and second materials is silicon oxide and the other is zirconium oxide or yttrium oxide.
39. A method of manufacturing an optical element for a lithography apparatus, wherein said method comprises providing one or more IR-suppression layers prior to depositing the first material.
40. A method according to Clause 38 or 39, wherein the steps of providing a first material and providing a second material are repeated at least once to form an oxygen barrier layer comprising a plurality of layers.
41. A method according to Clause 40, wherein the step of providing a first material and providing a second material is repeated from 2 to 10 times.
42. A method according to any of Clauses 38 to 41, wherein the first and/or second materials are provided by physical vapour deposition (PVD), reactive sputtering, co-sputtering, atomic layer deposition (ALD), plasma-enhanced ALD, thermal oxidation, or wet chemical passivation, or any other suitable deposition technique.

The invention claimed is:
1. A membrane assembly for EUV lithography, the membrane assembly comprising:
a membrane formed from at least one membrane layer comprising polycrystalline silicon or monocrystalline silicon; and
a border holding the membrane,
wherein the border is formed from a planar substrate comprising an inner region and a border region around the inner region,
wherein the border resulted from selective removal of the inner region of the planar substrate,
wherein the planar substrate supports the at least one membrane layer and a sacrificial layer such that the border supports the at least one membrane layer and the sacrificial layer, each of the planar substrate, sacrificial layer and at least one membrane layer being of a different material, wherein the sacrificial layer is between the planar substrate and the at least one membrane layer, and wherein an etch rate of an etchant of the planar substrate and the at least one membrane layer is different to the etch rate of the etchant of the sacrificial layer and the etch rate of the etchant of the sacrificial layer is at least ten times more than the etch rate of the etchant of the at least one membrane layer.

2. The membrane assembly of claim 1, wherein the sacrificial layer comprises silicon nitride.

3. The membrane assembly of claim 1, wherein the planar substrate comprises silicon.

4. The membrane assembly of claim 1, wherein the planar substrate and the at least one membrane layer comprise silicon.

5. The membrane assembly of claim 1, wherein the etch rate of the planar substrate is less than the etch rate of the sacrificial layer.

6. The membrane assembly of claim 5, wherein the etchant comprises phosphoric acid.

7. The membrane assembly of claim 1, wherein the membrane assembly is for a patterning device or a dynamic gas lock.

8. The membrane assembly of claim 1, wherein the membrane assembly comprises a ruthenium-based capping layer.

9. The membrane assembly of claim 8, wherein the ruthenium-based capping layer is arranged on a molybdenum layer.

10. The membrane assembly of claim 9, wherein the molybdenum layer is arranged on the planar substrate.

11. The membrane assembly of claim 9, further comprising a Ru/Mo intermixing layer at an interface of the molybdenum layer and the ruthenium-based capping layer.

12. The membrane assembly of claim 11, further comprising multiple Ru/Mo intermixing layers.

13. A method for manufacturing a membrane assembly for EUV lithography, the method comprising:
providing a stack comprising:
at least one membrane layer supported by a planar substrate, wherein the planar substrate comprises an inner region and a border region around the inner region; and
a sacrificial layer between the planar substrate and the membrane layer, each of the planar substrate, sacrificial layer and at least one membrane layer being of a different material;
selectively removing the inner region of the planar substrate such that the membrane assembly comprises: a membrane formed from the at least one membrane layer, and a border holding the membrane, the border comprising the border region of the planar substrate and the sacrificial layer situated between the border region and the membrane layer,
wherein the selectively removing the inner region of the planar substrate comprises using an etchant which has an etch rate for the membrane layer and its oxide that is different to an etch rate for the sacrificial layer and the etch rate of the etchant of the sacrificial layer is at least ten times more than the etch rate of the etchant of the at least one membrane layer.

14. The method according to claim 13, further comprising providing a resist on the stack and patterning the resist prior to the selectively removing the inner region.

15. A lithographic apparatus comprising the membrane assembly according to claim 1.

16. The method according to claim 13, wherein the etch rate of the planar substrate is less than the etch rate of the sacrificial layer.

17. The method according to claim 13, wherein the sacrificial layer comprises silicon nitride.

18. The method according to claim 13, wherein the etchant comprises phosphoric acid.

19. The method according to claim 13, wherein the membrane assembly comprises a ruthenium-based capping layer.

20. The method according to claim 13, wherein the membrane assembly is for a patterning device or a dynamic gas lock.

* * * * *